(12) United States Patent
Drachmann

(10) Patent No.: US 9,958,290 B2
(45) Date of Patent: May 1, 2018

(54) UTILITY METER CONTROLLING THE CONVERSION RANGE OF AN ADC

(71) Applicant: APATOR MIITORS APS, Aarhus V (DK)

(72) Inventor: Jens Drachmann, Viby J (DK)

(73) Assignee: APATOR MIITORS APS (DK)

( * ) Notice: Subject to any disclaimer, the term of this patent is extended or adjusted under 35 U.S.C. 154(b) by 0 days. days.

(21) Appl. No.: 14/653,710

(22) PCT Filed: Dec. 17, 2013

(86) PCT No.: PCT/DK2013/050434
§ 371 (c)(1),
(2) Date: Jun. 18, 2015

(87) PCT Pub. No.: WO2014/094782
PCT Pub. Date: Jun. 26, 2014

(65) Prior Publication Data
US 2015/0323343 A1    Nov. 12, 2015

(30) Foreign Application Priority Data

Dec. 18, 2012 (DK) ................................. 2012 70793

(51) Int. Cl.
*G08B 23/00* (2006.01)
*G01D 4/00* (2006.01)
(Continued)

(52) U.S. Cl.
CPC ............ *G01D 4/002* (2013.01); *H03M 1/002* (2013.01); *H03M 1/0626* (2013.01);
(Continued)

(58) Field of Classification Search
CPC ........ G01D 4/002; H03M 1/185; H03M 1/66; H03M 1/1245; H03M 1/0626; H03M 1/002; H03M 1/182
(Continued)

(56) References Cited

U.S. PATENT DOCUMENTS 5,027,117 A    6/1991   Yoshida et al.
5,194,865 A *  3/1993   Mason ................ H03M 1/0619
                                                              341/132
(Continued)

FOREIGN PATENT DOCUMENTS

EP        0545254 A2    6/1993
WO     2006021266 A1    3/2006

OTHER PUBLICATIONS

Danish Patent and Trademark Office—Search Report—Patent Application No. PA 2012 70793 dated Jul. 19, 2013 p. 1.
(Continued)

*Primary Examiner* — Dhaval Patel
(74) *Attorney, Agent, or Firm* — St. Onge Steward Johnston and Reens, LLC

(57) ABSTRACT

A utility meter for measuring a utility parameter is disclosed, the utility meter including a measuring system, an analog-to-digital converter having a conversion range, and a control unit, the measurement system being able to transmit a measurement signal representative of the utility parameter to the analog-to-digital converter, and the analog-to-digital converter being able to convert the measurement signal into a digital bit number and transmit the digital bit number to the control unit. The control unit controls the transmission of an ADC control signal based on a set of digital bit numbers to the analog-to-digital converter so as to control the conversion range. Furthermore, a method of operating a utility meter is disclosed.

19 Claims, 8 Drawing Sheets

Figure 1:
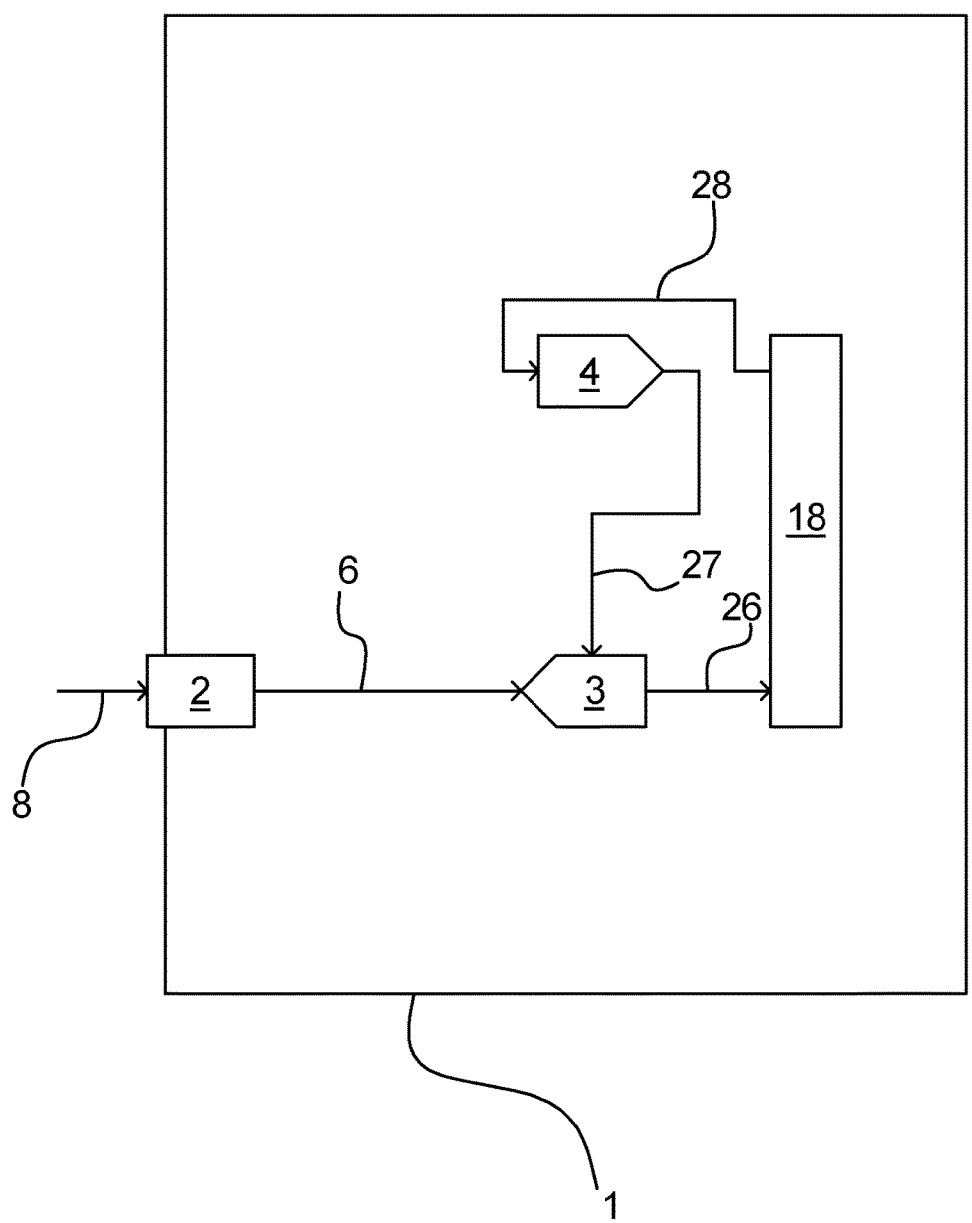

(51) Int. Cl.
*H03M 1/00* (2006.01)
*H03M 1/18* (2006.01)
*H03M 1/06* (2006.01)
*H03M 1/66* (2006.01)
*H03M 1/12* (2006.01)

(52) U.S. Cl.
CPC ......... *H03M 1/1245* (2013.01); *H03M 1/182* (2013.01); *H03M 1/185* (2013.01); *H03M 1/66* (2013.01)

(58) Field of Classification Search
USPC ...... 340/870.02, 384.71, 384.73; 235/462.25
See application file for complete search history.

(56) References Cited

U.S. PATENT DOCUMENTS

| | | | |
|---|---|---|---|
| 6,564,649 B1* | 5/2003 | Toda | G01F 1/663 73/861.26 |
| 2004/0134988 A1* | 7/2004 | Pettinelli, Jr. | H03M 1/182 235/462.25 |
| 2008/0172192 A1* | 7/2008 | Banhegyesi | G01R 22/10 702/61 |
| 2009/0201185 A1 | 8/2009 | Wu | |
| 2010/0226421 A1 | 9/2010 | Kibune | |
| 2013/0238259 A1* | 9/2013 | Ddoley | G01F 25/0007 702/45 |

OTHER PUBLICATIONS

International Search Report Application No. PCT/DK2013/050434 dated May 21, 2014 Completed: May 15, 2014 p. 2.

* cited by examiner

UTILITY METER CONTROLLING THE CONVERSION RANGE OF AN ADC

FIELD OF THE INVENTION

The present invention relates to a utility meter for measuring a utility parameter and a method of operating said utility meter.

BACKGROUND OF THE INVENTION

It is known to use analog-to-digital converters in utility meters.

A problem may, however, exist in that the analog-to-digital converters in such utility meters have a limited resolution.

BRIEF DESCRIPTION OF THE INVENTION

The invention relates to a utility meter for measuring a utility parameter comprising a measuring system, an analog-to-digital converter having a conversion range, and a control unit, said measurement system being adapted for measuring said utility parameter and transmitting a measurement signal representative of said utility parameter to said analog-to-digital converter, said analog-to-digital converter being adapted for converting said measurement signal into a digital bit number and transmitting said digital bit number to said control unit, wherein said control unit is configured for controlling the transmission of an ADC control signal based on a set of digital bit numbers to said analog-to-digital converter so as to control the conversion range.

In the context of the present invention, an analog-to-digital converter, also known as e.g. an ADC or A/D converter, is a device that converts the input continuous electrical signal to a digital number that represents the amplitude of the electrical signal.

In the present context a utility parameter may be a parameter, such as a consumption parameter of a utility, such as e.g. electricity, gas, such as natural gas, water, such as drinking water, tap water, or heating water for district heating, sewage, etc. For example the utility parameter may be representative of the instantaneous flow of water in a water meter measuring the consumption of tap water or drinking water. Such a water meter may for example be an ultrasonic water meter measuring the transit time parallel to the water flow direction, both in the upstream and the downstream directions. In such an ultrasonic water meter, the utility parameter may therefore be a transit time or representative of a transit time. In another example, the utility parameter may e.g. be a current in an electricity meter.

In the context of the present invention, a digital-to-analog converter, also known as e.g. a DAC, may be understood as a device that converts a digital (usually binary) code to an analog signal (such as current, voltage, or electric charge).

In the context of the present invention, it should be understood that the conversion range of the analog-to-digital converter is the range in which the analog-to-digital converter can accurately convert the measurement signal into a digital bit number. It is furthermore to be understood that the measurement signal is an analog signal. It should be understood in connection with the above that said set of digital bit numbers may comprise a plurality of digital bit numbers, such as e.g. 10, 20, 30, 40, 50, 75, 100, 200 or any other number of digital bit numbers.

An advantage of the invention may be that an effectively utilization of the conversion range of the analog-to-digital converter is achieved. A problem may exist in some setups, where a limited resolution of the analog-to-digital converter is available, e.g. for a 12-bit analog-to-digital converter. Therefore, it may be advantageous to use the entire conversion range of the analog-to-digital converter.

An advantage of the invention may be that an effectively utilization of the conversion range of the analog-to-digital converter may be achieved, even where the voltage range of a measurement signal of the utility meter changes over time.

An advantage of the invention may be that an effectively utilization of the conversion range of the analog-to-digital converter in order to extract an accurate temporal measurement value from the measurement signal of the utility meter may be achieved.

An advantage of the invention may be that the accuracy of the conversion of the analog measurement signal to the digital bit number is increased by the adaption of the conversion range of the analog-to-digital converter.

An advantage of the invention may be that the determination of a temporal value on the basis of the set of digital bit numbers from the analog-to-digital converter may be made more accurately due to the effective utilization of the conversion range of the analog-to-digital converter. I.e. for the same analog-to-digital converter, and without increasing the sampling frequency, a better temporal accuracy may be obtained by an effective utilization of the conversion range of the analog-to-digital converter.

A further advantage of the invention may be that a more precise and accurate determination of a temporal value on the basis of a set of digital bit numbers from the analog-to-digital converter may be achieved even with an analog-to-digital converter with a relatively low sampling frequency and/or a lower power consumption.

One advantage of the invention may be that a change in the signal strength of the measurement signal may be compensated for. E.g. when the utility meter has operated for some time, e.g. several years, the measurement signal may decrease due to decreased efficiency in the measuring of the utility parameter or wear of components e.g. in the measuring system, or the measurement signal may include errors or offsets due to wear of components e.g. in the measuring system. Especially in embodiments where the utility meter is an ultrasonic flow meter, this advantage may be significant, since the reflection and/or transmission of an ultrasonic signal in such setups may be less effective e.g. due to aggregation of debris etc. in the path of the ultrasound and near ultrasound transducers and/or reflectors, or due to decreasing efficiency of the ultrasound transducers. Therefore, utility meters according to the invention may provide for better and more accurate measurements, especially when evaluated over longer periods of time, such as several years, or up to the lifetime of the utility meter.

According to an embodiment of the invention, said measurement system should preferably be understood as comprising components need to perform a desired measurement of a utility parameter. For example, in embodiments where the utility meter is an ultrasonic flow meter for measuring a flow through a flow channel, such as a tube, the measurement system may comprise the necessary components to perform a flow measurement by means of ultrasound. This may e.g. be two ultrasound transducers, an electronic circuit for controlling them, and, optionally, one or more ultrasound reflectors for reflecting an ultrasound signal emitted from one ultrasound transducers unto the opposite ultrasound transducer. Thereby, the ultrasonic flow meter is adapted for measuring said utility parameter. Other meters may comprise other components, typically comprising a measurement unit for measuring the physical utility parameter and, optionally, other units or arrangements, such as electronic circuits connected to and controlling the measurement unit. Furthermore, according to an embodiment, the measurement system is connected to an analog-to-digital converter and thereby adapted for transmitting a measurement signal representative of said utility parameter to said analog-to-digital converter. This connection may preferably be an electrical connection, either direct, or via one or more components, such as filters and/or amplifiers. Furthermore, according to an embodiment, said control unit is electrically connected to said analog-to-digital, either directly, or through other units, such as a digital-to-analog converter and possibly further units or components. The control unit also comprises a signal output, which can output an electrical signal. Thereby, the control unit is configured for controlling the transmission of an ADC control signal based on a set of digital bit numbers to said analog-to-digital converter. Finally, by controlling the ADC control signal received by the analog-to-digital converter, the control unit is able to control the conversion range of the analog-to-digital converter.

According to an embodiment of the invention, said digital-to-analog converter comprises a DAC reference input for receiving a reference voltage. This voltage is preferably a fixed value. Furthermore, at least in some embodiments where the analog measurement signal is amplified by and amplifier before the analog-to-digital converter, the power source of the amplifier is de-coupled from the power source providing the reference value of the digital-to-analog converter. This de-coupling may be realized by using two separate voltage sources or by using filtering arrangement between the DAC reference input and the amplifier.

According to an advantageous embodiment of the invention, said utility meter furthermore comprises a digital-to-analog converter, said digital-to-analog converter being configured for receiving a DAC control signal from said control unit, converting said DAC control signal into said ADC control signal and transmitting said ADC control signal to said analog-to-digital converter.

An advantage of the invention may be that the resolution of the analog-to-digital converter is effectively utilized by controlling the ADC reference input using a digital-to-analog converter.

By using the digital-to-analog converter according to the above embodiment, the control unit may control the transmission of the ADC control signal to the analog-to-digital converter.

According to an embodiment of the invention, said analog-to-digital converter is configured for receiving said ADC control signal being controlled by the control unit on the basis of the set of digital bit numbers, so as to adjustably control the conversion range of the analog-to-digital converter based on said ADC control signal.

According to an example embodiment, said measuring system comprises a measurement output, said analog-to-digital converter comprises an ADC signal input, an ADC signal output, and an ADC reference input, said digital-to-analog converter comprises a DAC signal output, a DAC signal input, and a DAC reference input, and said control unit comprises a control unit output and a control unit input. Furthermore, said measurement output is electrically connected to said ADC signal input, said ADC signal output is electrically connected to said control unit input, said control unit output is electrically connected to said DAC signal input, said DAC signal output is electrically connected to said ADC reference input. Furthermore, a voltage source, such as a battery, may be electrically connected to said DAC reference input. Furthermore, said measuring system is configured for transmitting a measurement signal representative of said utility parameter from said measurement output, said analog-to-digital converter being adapted for receiving said measurement signal from said ADC signal input and transmitting said digital bit number on from said ADC signal output, said control unit is a adapted for receiving said digital bit number from said control unit input and for transmitting said DAC control signal from said control unit output, said digital-to-analog converter being adapted for receiving said a reference voltage from said DAC reference input, converting said DAC control signal, which is a digital signal, into said ADC control signal, which is an analog signal, on the basis of said received reference signal, and transmitting said ADC control from said DAC signal output, and finally said analog-to-digital converter being adapted for receiving said ADC control signal from said ADC reference input and performing the conversion of said measurement signal to said digital bit number using said ADC control signal as reference value to determine the conversion range of the analog-to-digital converter, i.e. voltage range in which the analog-to-digital converter can accurately convert, within its bit-resolution, an analog signal accurately into a digital bit number. Therefore, said control unit is adapted to control the voltage to the DAC signal input on the basis of a set of digital bit numbers received from the analog-to-digital converter.

According to an embodiment if the invention, the analog-to-digital converter may have a second reference input, which may be connected to ground.

According to an embodiment if the invention, the digital-to-analog converter may have a second reference input, which may be connected to ground.

According to the above embodiment, it should be understood that connected may preferably in the present context be understood as electrically connected, with or without intermediate amplification.

According to an advantageous embodiment of the invention, said utility meter is adapted to extract timing data from said set of digital bit numbers.

An advantage of the above embodiment may be that by a timing value from said set of digital bit numbers, the temporal accuracy of the timing value is increased by adapting the conversion range of the analog-to-digital converter to the measurement signal using the representation of said set of digital bit numbers.

A further advantage of the above embodiment may be that by using the timing value, any problems with translating the digital bit numbers into a voltage value may be avoided, especially when only timing data is needed. The problem occurs since the reference value of the analog-to-digital converter changes, since the ADC control signal changes. Since the exact ADC control signal may be unknown, e.g. if the DAC reference value is unknown or if other values contribute to the analog-to-digital conversion or to the measurement signal, such as e.g. non-constant DC offset, the absolute value of voltage amplitudes of corresponding to the digital bit numbers may be impossible or at least very hard and costly, either in equipment need and/or in power need, to obtain.

Furthermore, according to an embodiment of the invention, the signal may be understood to be normalized during the analog-to-digital conversion, and since this normalization may be changed between different sets of digital bit numbers, digital bit numbers from different sets of digital bit numbers may be incomparable. Therefore, even relative values of voltage amplitudes corresponding to the digital bit numbers may be impossible or at least very hard and costly, either in equipment need or in power need, to obtain. However, when using set of digital bit numbers to extract timing data, such as e.g. a frequency, the timing of occurrence of an extremum value, such as a maximum or minimum or other timing data, the problem of calculating absolute voltage values from the digital bit numbers may be avoided, while at the same time obtaining a more accurate determination of the timing data due to the more effective utilization of the conversion range of analog-to-digital converter.

According to an advantageous embodiment of the invention, said utility meter is an ultrasonic flow-meter measuring fluid flow through a flow compartment.

An advantage of the above embodiment may be that the ultrasonic flow-meter according to the present embodiment may measure transit time more accurately due to a more effective utilization of the conversion range of the analog-to-digital converter, i.e. the rounding off of the analog value into digital values becomes less significant leading to a more accurate transit time measurement.

According to an embodiment of the invention, said utility meter is an ultrasonic flow-meter measuring fluid flow through a flow compartment, said measuring system of said ultrasonic flow meter comprising a first and a second ultrasound transducer, said ultrasonic flow meter furthermore comprising one or more ultrasound reflectors, preferably 1-5 ultrasound reflectors, more preferably 2-4 ultrasound reflectors, most preferably 3 ultrasound reflectors, wherein said ultrasound reflectors and said first and second ultrasound transducers are positioned and orientated such that an ultrasound signal emitted by said first ultrasound transducer will propagate via reflections of said one or more ultrasound reflectors onto said second ultrasound transducer where the ultrasound signal is converted into an electrical signal, and vice versa. For example, said ultrasonic flow meter may be adapted to transmit an ultrasound signal from said first transducer to said second transducer and also vice versa in accordance with the above, and then calculate the flow through the compartment based on received ultrasound signals, such as information about transit time extracted from said ultrasound signals.

According to an advantageous embodiment of the invention, said utility meter furthermore comprises a microcontroller, said digital-to-analog converter and said analog-to-digital converter being contained in said microcontroller.

An advantage of the above embodiment may be that obtaining an effective interaction between the analog-to-digital converter and the digital-to-analog converter is more easily achieved, and may be achieved for relatively cheap microcontrollers. This may e.g. be due to easy integration of common timing arrangements in the microcontroller. Thereby, an effective utility meter comprising the analog-to-digital converter and the digital-to-analog converter may be achieved with relatively low-cost components.

According to a further embodiment, said utility meter comprises a microcontroller, said microcontroller comprising on or more of said digital-to-analog converter, said analog-to-digital converter, and said control unit. Also, when the utility meter comprises several digital-to-analog converters, said microcontroller may preferably comprise all these. Furthermore, the microcontroller may comprise further components. Furthermore, the microcontroller may provide, fully or partly, for electrical connections between said components.

According to an advantageous embodiment of the invention, said utility meter comprises a filtering arrangement for filtering the output of said analog-to-digital converter.

An advantage of the above embodiment may be that by filtering noise from the output of the analog-to-digital converter, noise induced in the digital signal from the analog-to-digital converter may be filtered away, especially when the measurement signal from the measurement system is well-defined in frequency space. E.g. this filtering may be digital filtering of the signal, e.g. by performing fast Fourier transformation to filter away unwanted frequency components.

According to an advantageous embodiment of the invention, said control unit is adapted to control the ADC control signal based on at least a maximum value of said digital bit numbers of said set of digital bit numbers.

An advantage of the above embodiment may be that the measurement signal does not exceed the upper limit of the conversion range of the analog-to-digital converter, or at least that this may be so when the measurement signal is sufficiently slowly varying and a safety margin of e.g. 5 or 10% is used.

Alternatively, many other strategies may be used. E.g. other factors may be taken into account further to the above, such as e.g. minimum value of said digital bit numbers of said set of digital bit numbers.

According to an advantageous embodiment of the invention, said control unit is adapted to control the ADC control signal based on at least a minimum value of said digital bit number of said set of digital bit numbers.

An advantage of the above embodiment may be that the measurement signal does not exceed the lower limit of the conversion range of the analog-to-digital converter, or at least that this may be so when the measurement signal is sufficiently slowly varying and a safety margin of e.g. 5 or 10% is used.

Alternatively, many other strategies may be used. E.g. other factors may be taken into account further to the above, such as e.g. maximum value of said digital bit numbers of said set of digital bit numbers and/or an average value of said digital bit numbers of said set of digital bit numbers.

According to an advantageous embodiment of the invention, said measurement signal comprises an AC signal part and a DC signal part, and said control unit is adapted to modify said DC signal part relative to the conversion range of the analog-to-digital converter.

An advantage of the above embodiment is that a more efficient utilization of the conversion range of the analog-to-digital converter may be obtained. This may be done by controlling the DC signal part, e.g. by adding or subtracting a certain DC level so as to adjust the measurement signal to be symmetric or more symmetric in the conversion range of the analog-to-digital converser. Alternatively, it may be done by adjusting the conversion range of the analog-to-digital converter, e.g. using an analog-to-digital converter with two reference inputs, and applying appropriate voltages to these reference inputs.

An advantage of the above embodiment may be that the conversion range of the analog-to-digital converter is effectively utilized, even where a DC voltage offset of a measurement signal of the utility meter changes over time.

According to an advantageous embodiment of the invention, said utility meter furthermore comprises a DC offset modifier, said control unit is adapted to control the transmission of a DC modification signal to the DC offset modifier, and said DC offset modifier is adapted to modify a DC level of the measurement signal.

According to an alternative embodiment, the conversion range of the analog-to-digital converter may be adjusted to match the measurement signal, which may include a DC offset part. This may e.g. be done using an analog-to-digital converter with two reference inputs, and applying appropriate voltages to these reference inputs. In an example embodiment, where the signal varies between e.g. 3 and 6 volts, voltages of e.g. 2.5 volts and 6.5 volts may be applied to the reference inputs of the analog-to-digital converter, respectively, thereby setting up a conversion range of 2.5 to 6.5 volts for the analog-to-digital converter.

According to an advantageous embodiment of the invention, said utility meter furthermore comprises a second digital-to-analog converter, said control unit is configured to transmit a second DAC control signal to the second digital-to-analog converter, and said second digital-to-analog converter is adapted to convert the second DAC control signal into said DC modification signal.

By means of the above embodiment, an advantage of controlling a DC part of said measurement signal relative to said conversion range of said analog-to-digital converter so as to achieve maximum utilization of said conversion range may be obtained.

According to an advantageous embodiment of the invention, said control unit furthermore comprises a control unit signal output electrically connected to an interface signal input of a communication interface.

In the present context it should be understood that a communication interface may be a display for displaying a value representative of the consumption, such as the instantaneous consumption or accumulated consumption, or the communication interface may represent other units, which the measurement bit numbers is transmitted to, such as processing units, memory units, or communications units for communicating to external measurement collecting stations, e.g. for so-called smart meters, or any other units in the utility meter, or any combination the aforementioned units.

According to an advantageous embodiment of the invention, said utility meter comprises a voltage source for supplying voltage to said amplifier, and for supplying a reference voltage to said digital-to-analog converter.

An advantage of the above embodiment may be that the utility meter may be powered by a single power source, such as a single battery.

According to an advantageous embodiment of the invention, said voltage source is de-coupled between the digital-to-analog converter and the amplifier by a de-coupling arrangement.

An advantage of the above embodiment may be that the utility meter may be powered by a single power source, such as a single battery without inducing further noise in the measurements, i.e. without reducing the signal-to-noise ratio of the digital bit numbers.

According to an advantageous embodiment of the invention, said set of digital bit numbers comprises between 10 and 500 digital bit numbers.

In alternative embodiment, said set of digital bit numbers comprises at least 10 digital bit numbers, such as at least 20 digital bit numbers, such as at least 30 digital bit numbers, such as at least 40 digital bit numbers, such as at least 50 digital bit numbers, such as at least 75 digital bit numbers, such as at least 100 digital bit numbers. Furthermore, according to various example embodiments, the set of digital bit numbers may comprise between 20 and 100 digital bit numbers, such as between 30 and 50 digital bit numbers, or any other relevant number of bits.

According to an advantageous embodiment of the invention, said utility meter furthermore comprises an amplifier, said amplifier being connected so as to amplify said measurement signal before the conversion of the measurement signal into said digital bit number in said analog-to-digital converter.

An advantage of the above embodiment may be that the signal strength is sufficient for the analog-to-digital converter to perform its conversions of the measurement signals into the digital bit numbers.

According to an embodiment of the invention, said amplifier is an operational amplifier.

According to an embodiment of the invention, the digital-to-analog converter comprises a DAC signal input, and wherein said digital-to-analog converter is adapted to convert a DAC signal input signal, being a digital signal, on said DAC signal input to a DAC signal output voltage, being an analog signal, on said DAC signal output.

According to an embodiment of the invention, said analog-to-digital converter comprises an ADC signal input and an ADC reference input, said ADC signal input being a differential input adapted for receiving a differential signal, said ADC signal input comprising a first ADC signal input, a second ADC signal input, said analog-to-digital converter being adapted for measuring a differential signal between said first and second ADC signal inputs, said first ADC signal input being electrically connected to said measuring system.

One advantage of the above embodiment may be that it may be implemented using relatively simple and cheap electronic circuits. Therefore, when using analog-to-digital converters converting the differential signal between the first and second ADC signal inputs, an advantageous embodiment is obtained.

One significant advantage of the above embodiment may be that it is possible to use integrated circuits comprising the analog-to-digital converter, the digital-to-analog converter (s), and the microcontroller in a single integrated circuit. Furthermore, when using a differential input analog-to-digital converter, one may use integrated circuits with only one reference input. This may be significant since such circuits may be considerably cheaper than multi reference input circuits. At the same time, a relatively effective utilization of the conversion range of the analog-to-digital converter may be realized resulting in a relatively cheap yet accurate utility meter.

According to an embodiment, the second ADC signal input may be connected to a fixed voltage source, or be controlled by the control unit e.g. by said second ADC signal input being connected to an output of a second digital-to-analog converter having an input being controlled by the control unit. Also, these two solutions may also be combined, e.g. by combining a voltage of the fixed voltage source with an output voltage from the second digital-to-analog converter through a voltage divider.

According to an alternative embodiment, the second ADC signal input may be connected, through a low-pass filter, to the first ADC signal input.

According to an embodiment of the invention, the control unit is adapted to at least partly control the voltage of said second ADC signal input.

According to an embodiment, the second ADC signal input may be controlled by the control unit e.g. by said second ADC signal input being connected to an output of a second digital-to-analog converter having an input being controlled by the control unit. Also, this solution may also be combined with other solutions, e.g. by combining a voltage of a fixed voltage source with an output voltage from the second digital-to-analog converter through a voltage divider.

According to an embodiment of the invention, said analog-to-digital converter comprises an ADC reference input, and the conversion range of said analog-to-digital converter is defined as the range from minus the voltage value on said ADC reference input to plus the voltage value of said ADC reference input.

One advantage of the above embodiment may be that it may be implemented using relatively simple and cheap electronic circuits. Especially, it may be advantageous to be able to control the conversion range of the analog-to-digital converter by only a single ADC reference input.

According to an embodiment of the invention, said measurement signal transmitted from said measuring system is an AC signal. In should be understood that in some embodiments, a DC signal may be superposed on the AC signal; however, it may often be advantageous to remove such DC signals e.g. by filtering.

According to an embodiment of the invention, the analog-to-digital converter having a differential input, the digital-to-analog converter(s), and the microcontroller are integrated in a single integrated circuit having only one reference input.

One advantage of the above embodiment may be that such circuits may be considerably cheaper than multi reference input circuits. At the same time, a relatively effective utilization of the conversion range of the analog-to-digital converter may be realized resulting in a relatively cheap yet accurate utility meter The invention furthermore relates to a method of operating a utility meter, said utility meter comprising a measuring system, an analog-to-digital converter, and a control unit, said analog-to-digital converter having a conversion range, the method comprising the steps of measuring a utility parameter by said measuring system and transmitting a corresponding measurement signal to said analog-to-digital converter, converting the measurement signal into a digital bit number by said analog-to-digital converter and transmitting said digital bit number to said control unit, controlling by said control unit the transmission of an ADC control signal based of a set of digital bit numbers to said analog-to-digital converter so as to control the conversion range.

According to an advantageous embodiment of the invention, said utility meter furthermore comprises a digital-to-analog converter, said step of controlling the transmission of said ADC control signal comprises the steps of said control unit transmitting a DAC control signal, said digital-to-analog converter converting said DAC control signal into said ADC control signal and transmitting said ADC control signal to said analog-to-digital converter.

According to an advantageous embodiment of the invention, a method according to any of the previous embodiments is adapted for operating a utility meter according to any of the previous embodiments.

According to an advantageous embodiment of the invention, a utility meter according to any of the previous embodiments is adapted to operate in accordance with the method according to any of the previous embodiments.

FIGURES

The invention will now be described with reference to the drawings, where

Figure 2:
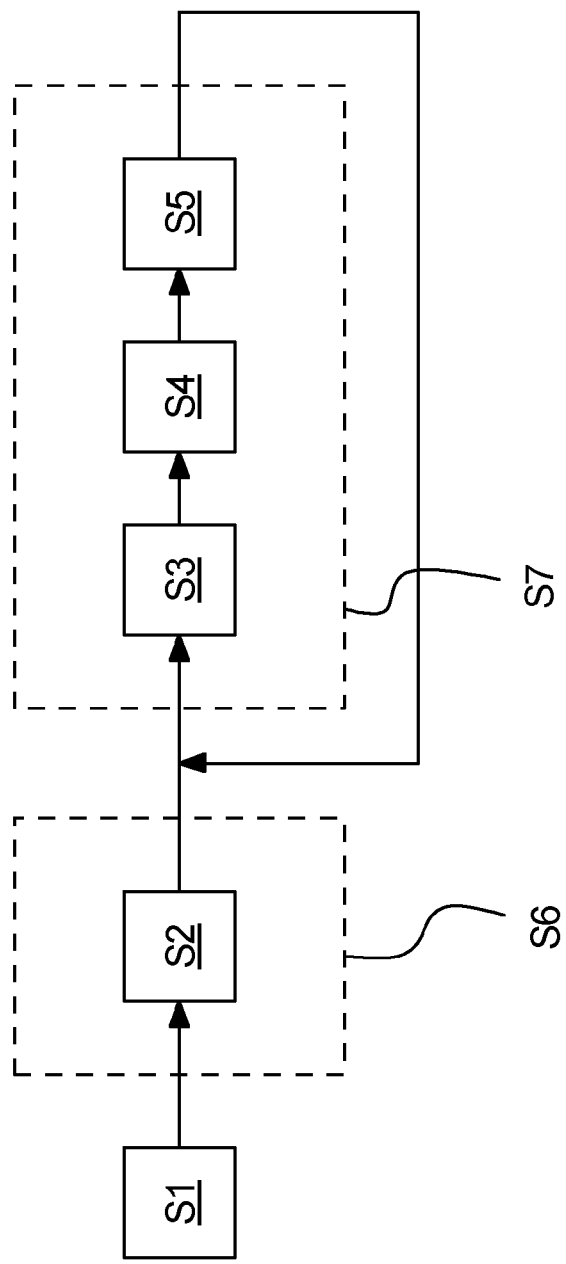
Figure 3:
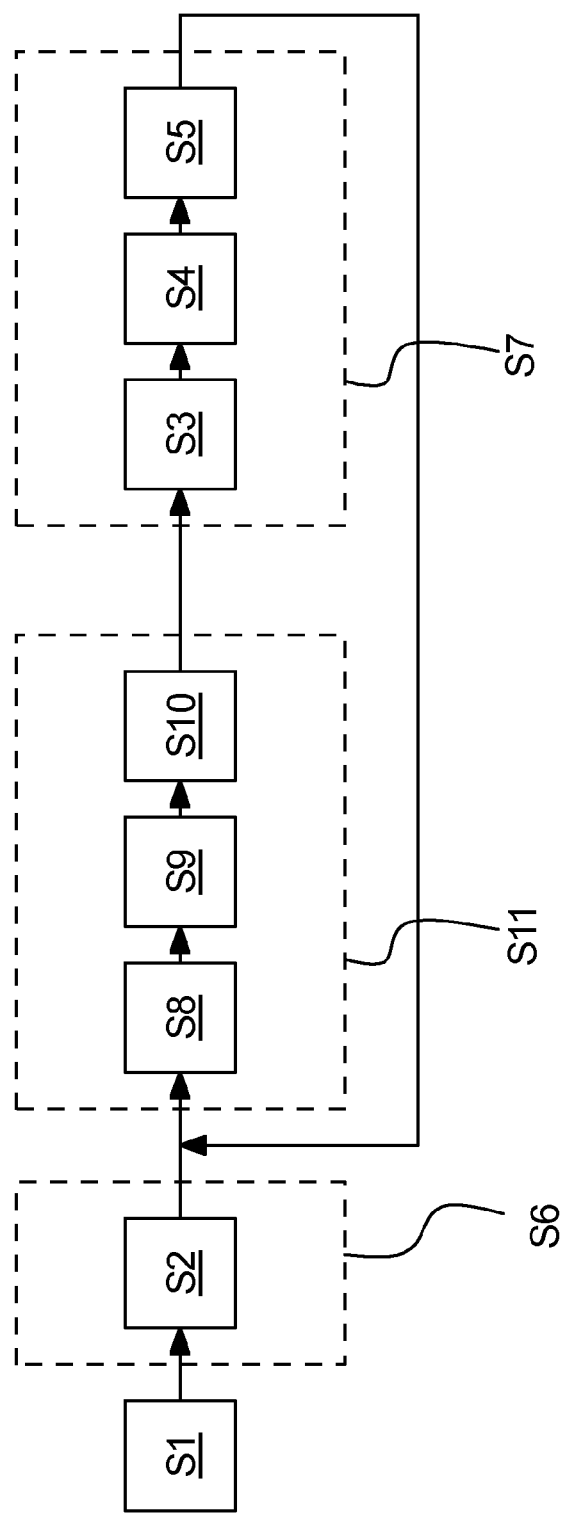
Figure 4:
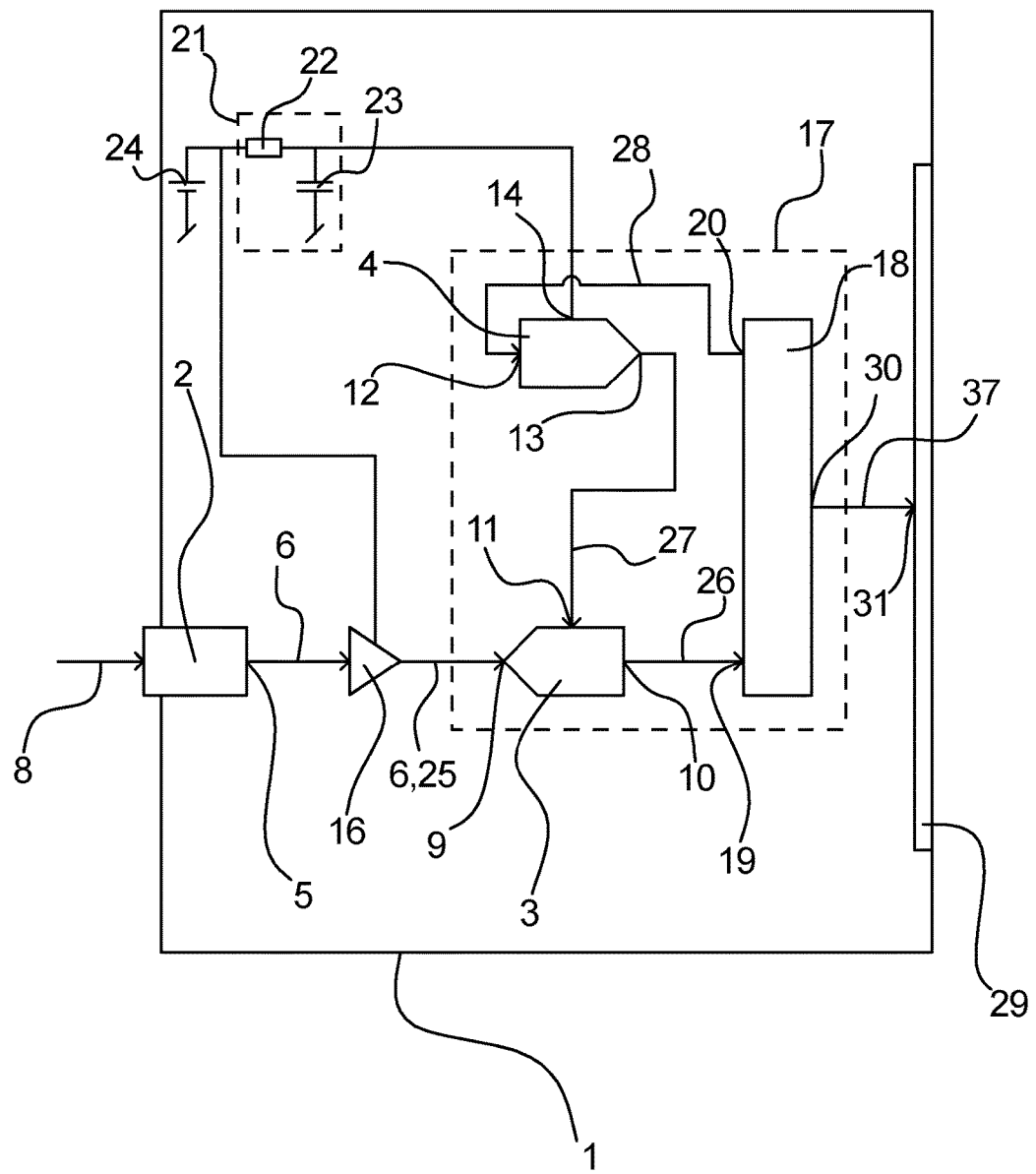
Figure 5:
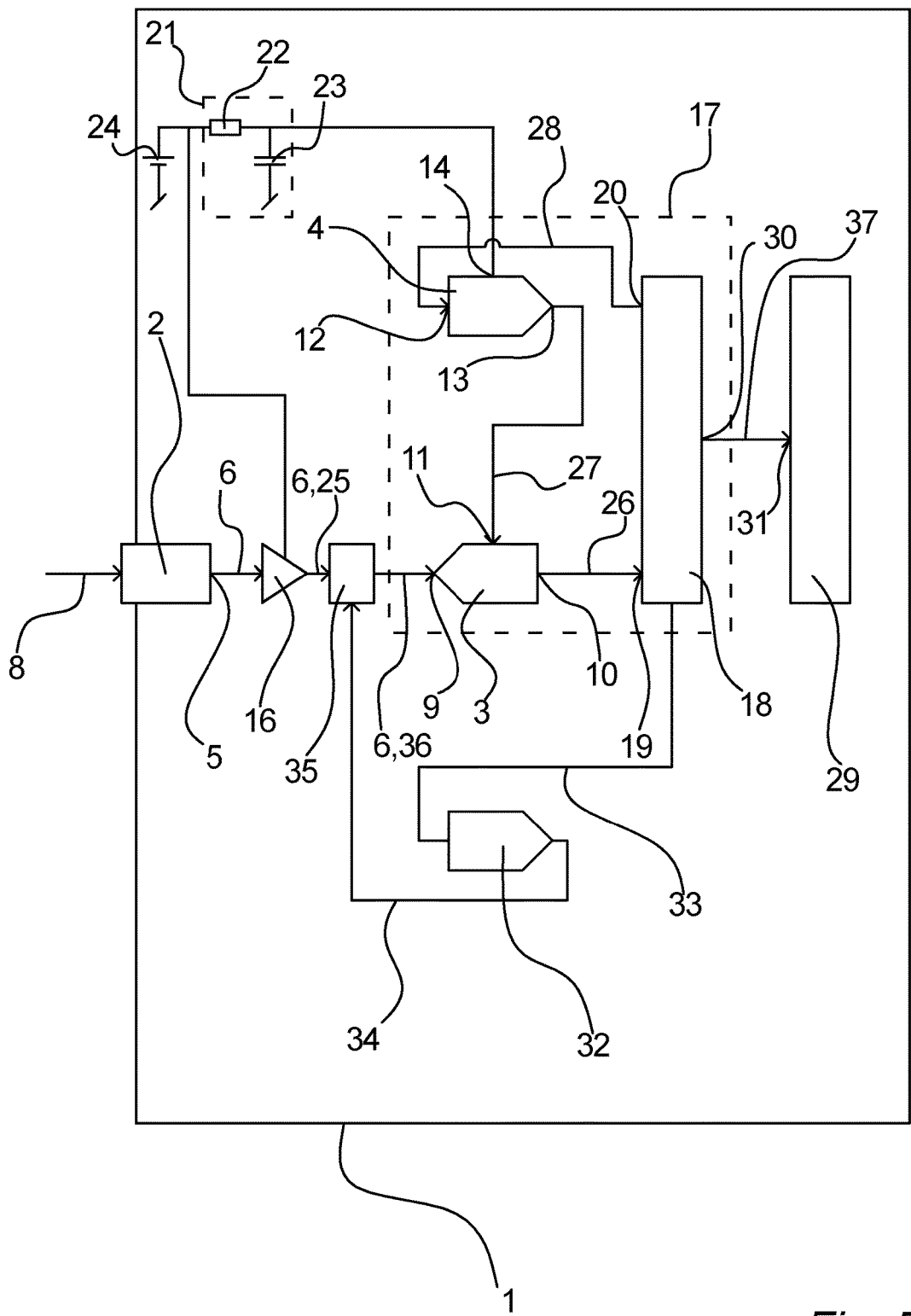
Figure 6:
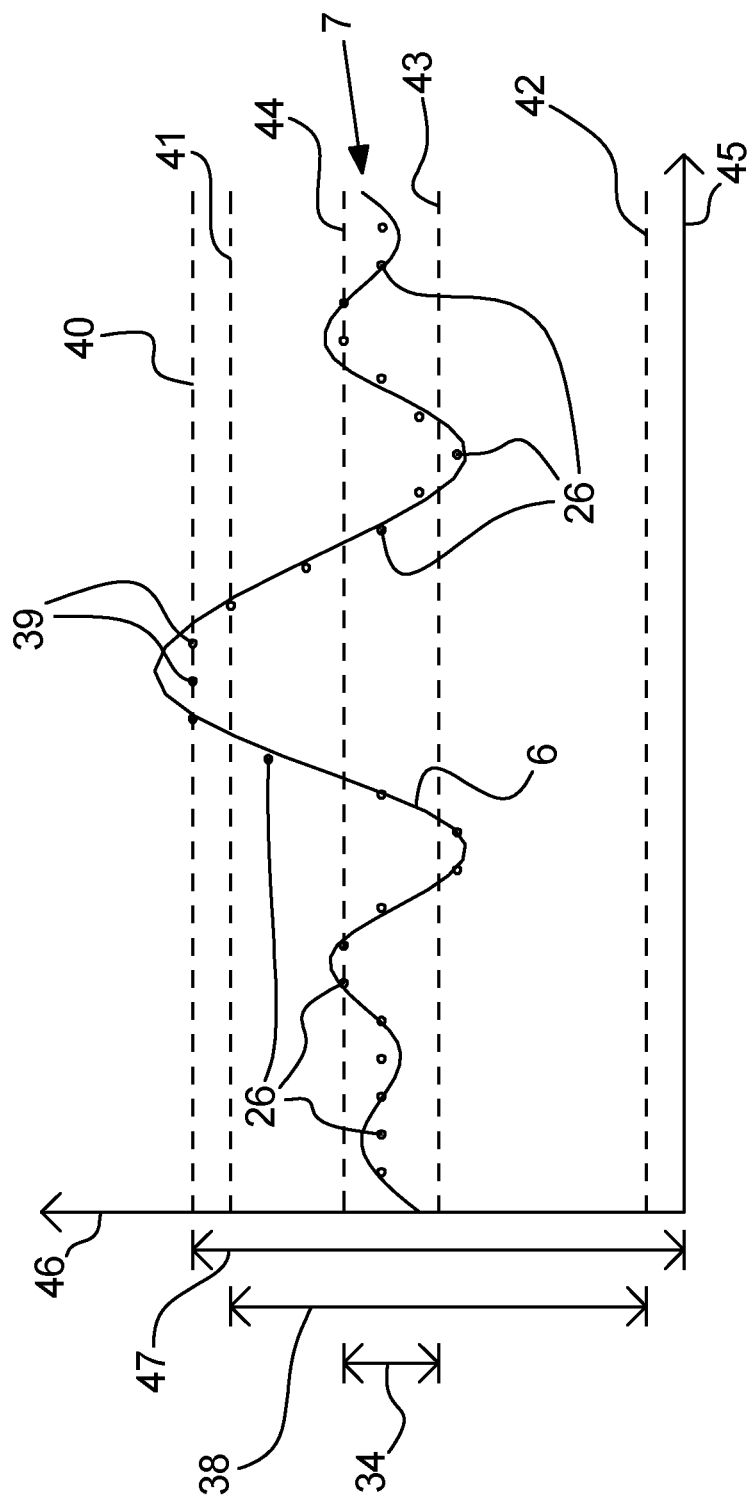
Figure 7:
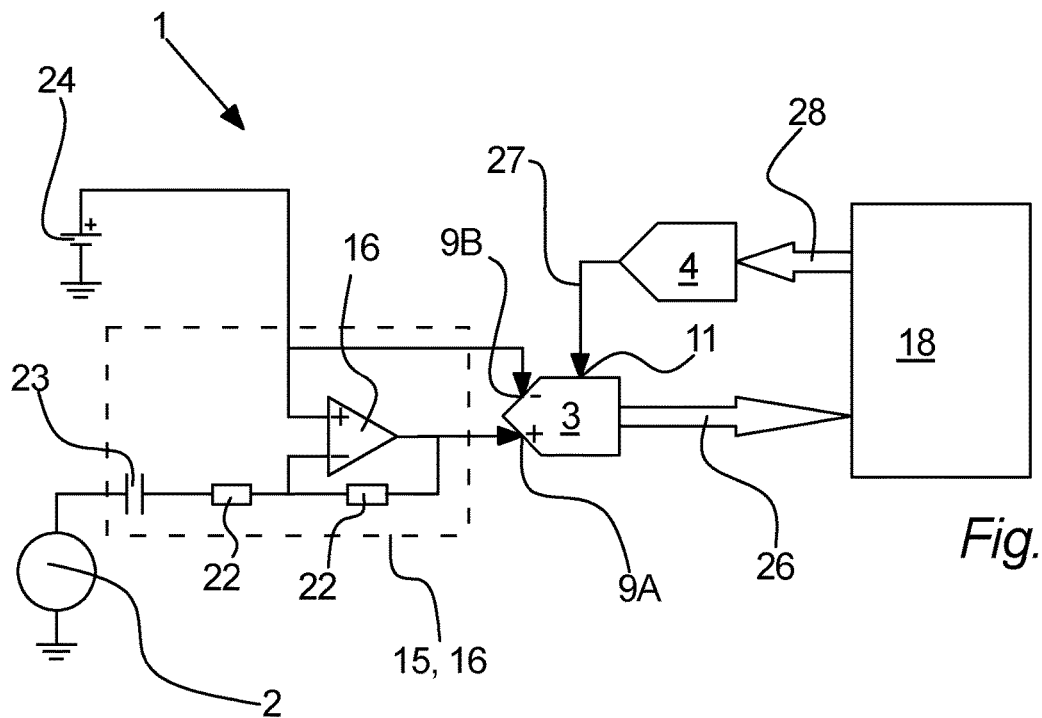
Figure 8:
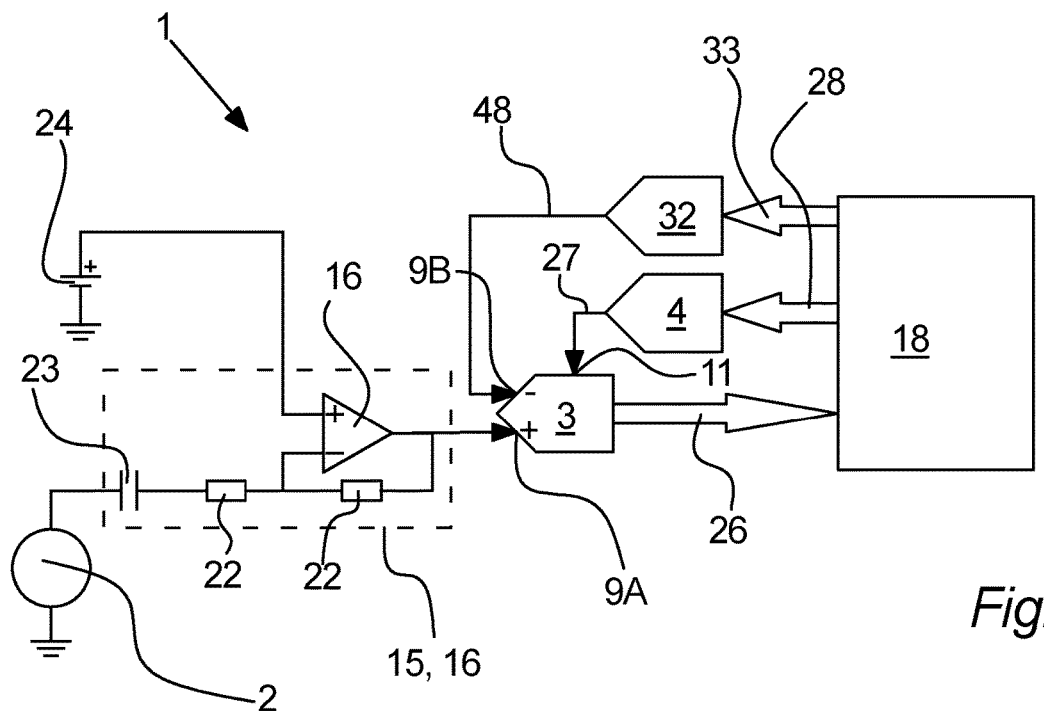
Figure 9:
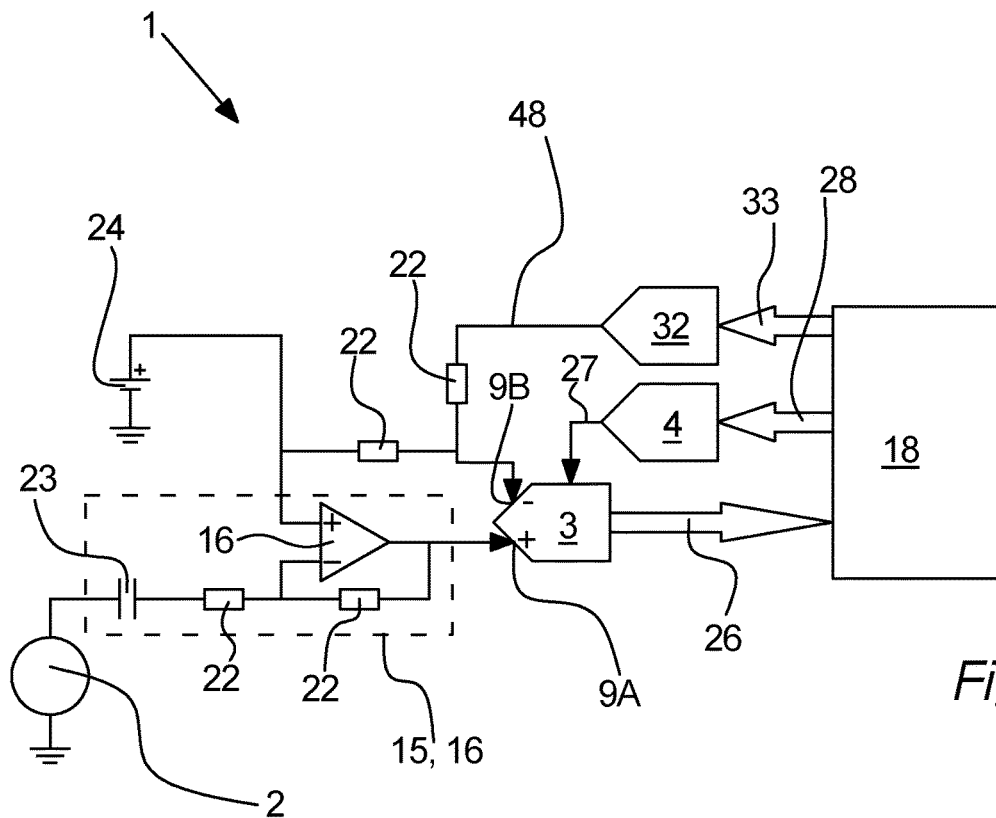
Figure 10:
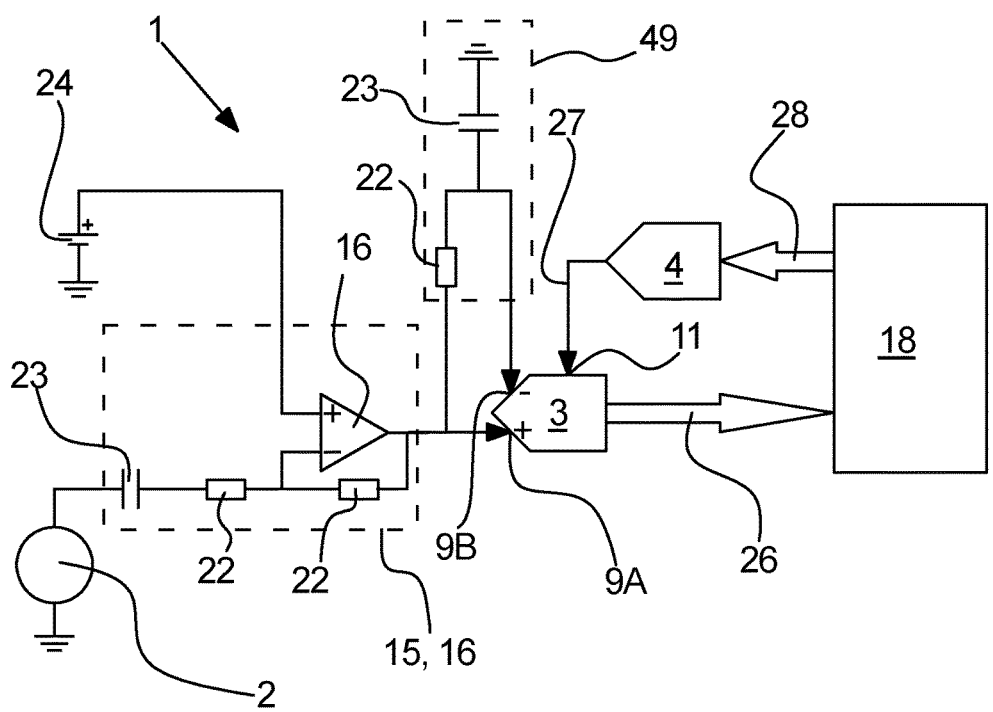

FIG. 1 illustrates a utility meter 1 according to an embodiment of the invention, FIG. 2 illustrates a control sequence of a utility meter 1 according to an embodiment of the invention, FIG. 3 illustrates a control sequence of a utility meter 1 according to an embodiment of the invention, FIG. 4 illustrates a utility meter 1 according to an embodiment of the invention, FIG. 5 illustrates a utility meter 1 according to an embodiment of the invention, FIG. 6 illustrates an analog measurement signal 6 according to an embodiment of the invention, FIG. 7 illustrates a utility meter 1 according to an embodiment of the invention, FIG. 8 illustrates a utility meter 1 according to an embodiment of the invention, FIG. 9 illustrates a utility meter 1 according to an embodiment of the invention, FIG. 10 illustrates a utility meter 1 according to an embodiment of the invention.

DESCRIPTION OF THE INVENTION

Referring to FIG. 1, a utility meter 1 according to an embodiment of the invention is illustrated. The utility meter 1 comprises a measurement system 2, an analog-to-digital converter 3, and a digital-to-analog converter 4. The measurement system 2 comprises a measurement output 5 for outputting a measurement signal 6 representative of a measured utility parameter 6. The digital-to-analog converter 4 comprises a DAC signal output 13 for outputting an ADC control signal 27. The analog-to-digital converter 3 comprises an ADC signal input 9 being electrically connected to the measurement output 5 and being adapted for receiving the measurement signal 6, an ADC signal output 10 for outputting a digital bit number 26, and an ADC reference input 11 electrically connected to the DAC signal output 13 and being adapted for receiving the ADC control signal 27. The ADC control signal 27 is calculated on the basis of a any of the previous embodiments is adapted of digital bit numbers 26 from the analog-to-digital converter 3. Specifically, the ADC control signal 27 is increased if any of the values of the set of digital bit numbers 26 exceeds the conversion range 47 of the analog-to-digital converter 3. Moreover, the ADC control signal 27 is decreased when the values of the digital bit numbers 26 in a set of digital bit numbers 26 is sufficiently below the maximum limit and sufficiently above the minimum limit of the conversion range 47 of the analog-to-digital converter 3.

Referring to FIG. 2, a method of operating a utility meter 1 according to an embodiment of the invention is illustrated. The utility meter 1 comprises a measuring system 2, an analog-to-digital converter 3, and a control unit 18, said analog-to-digital converter 3 having a conversion range 47. The method of this embodiment comprises a start S1, an initiation sequence S6, and a measurement sequence S7. The measurement sequence S7 may be repeated for repeated measurements as long as the utility meter 1 is running. If, for some reason, the operation of the utility meter 1 is interrupted, the control sequence may be initiated from the start S1. Now, in more detail, the initiation sequence S6 comprises at least an estimation step S2 of estimating a voltage value for the digital-to-analog converter 4 to output. This estimation may be performed in various different ways, e.g. by using previously measured values, estimates based on previously measured values, such as projections or extrapolations of previously measured values, time-of-the-day considerations, time-of-the-year considerations, by using a fixed value such as a maximum value, or by combinations of two or more of these ways, or by other ways. By means of this estimation step S2, the best value for the digital-to-analog converter 4 may be set. The measurement sequence S7 according to the present embodiment comprises the following steps, an measuring step S3, a conversion step S4, and a control step S5. The measurement step S3 comprises measuring a utility parameter 8 by said measuring system 2 and transmitting a corresponding measurement signal 6 to said analog-to-digital converter 3. The conversion step S4 comprises converting the measurement signal 6 into a digital bit number 26 by said analog-to-digital converter 3 and transmitting said digital bit number 26 to said control unit 18. The controlling step S5 comprises controlling by said control unit 18 the transmission of an ADC control signal 27 based on a set of digital bit numbers 26 to said analog-to-digital converter 3 so as to control the conversion range 47.

According to one embodiment, a method of operating a utility meter 1 comprises the above described measurement sequence S7, comprising a measuring step S3, a conversion step S4, and a control step S5.

Now, according to a more specific embodiment, the control step S5 comprises a DAC control step of transmitting a DAC control signal 28 to a digital-to-analog converter 4, and an ADC control step of converting said DAC control signal 28 into an ADC control signal 27 by means of said digital-to-analog converter 4 and transmitting said ADC control signal 27 to the analog-to-digital converter 3. Thereby the input reference voltage of the analog-to-digital converter 3 is determined. The measurement step S3 comprises the measurement system 2 of the utility meter 1 performing a measurement of a utility parameter 8, sending an analog electrical measurement signal 6 representative of this measurement to the analog-to-digital converter 3. The conversion step S4 comprises the analog-to-digital converter 3 converting the input voltage of the measurement signal 6 into a digital bit number 26 using the ADC control signal 27 from the digital-to-analog converter 4 as reference. This is repeated over a certain time period, such as a predetermined time period, until a number of voltage values for the measurement signal 6 are recorded as digital bit numbers 26. As an example, e.g. 40 measurements may be performed, or 100 measurements, or another number of measurements depending on the situation. Finally, the control step S5 comprises the control unit 18 evaluating the digital bit numbers 26 received from the analog-to-digital converter 3. This evaluation comprises evaluating to which degree the conversion range 47 of the analog-to-digital converter 3 is effectively utilized, i.e. if the conversion range 47 of the analog-to-digital converter 3 is too large or too small compared to voltage amplitude of the measurement signal 6. E.g. if the conversion range 47 of the analog-to-digital converter 3 is exceeded or close to being exceeded, the control step S5 comprises increasing the conversion range 47 of the analog-to-digital converter 3, or if the voltage amplitude of the measurement signal 6 is relatively small compared to the conversion range 47, the conversion range 47 may be decreased. Furthermore, in some embodiments, the control step S5 comprises evaluating if the measurement signal 6 is symmetric relative to the conversion range 47 of the analog-to-digital converter 3, or if there is a DC offset, and if such DC offset exists modifying the measurement signal 6 to make it symmetric relative to the conversion range 47.

In the present embodiment, based on the control step S5, a new output voltage of the digital-to-analog converter 4 is set, the measurement step S3 is repeated, the conversion step S4 is also repeated, the evaluation step S5 is repeated based on the new measured measurement signal 6 and converted bit numbers 26 etc., i.e. the measurement sequence S7 is repeated using the output of the evaluation step S5 as an input for the DAC output setting step S3. Especially when the utility parameter 8, which is measured, is a relatively slowly changing, i.e. it changes only little between each measurement sequence S7, the conversion range 47 of the analog-to-digital converter 3 will be relatively well-adjusted for the next measurement.

In more detail, according to various embodiments, the control step S5 may evaluate the output digital bit numbers 26 from the analog-to-digital converter 3 according to different strategies. In one example embodiment, the evaluation step S5 may operate to utilize e.g. 90-95% of the conversion range 47 of the analog-to-digital converter 3, i.e. keeping a safety-margin of approximately 5-10%. However, where the input signal to the analog-to-digital converter 3 has a DC offset, i.e. is asymmetric relative to the conversion range 47 of the analog-to-digital converter 3, the safety margin of e.g. 5-10% may of course be effective for the closest to the limit of the conversion range 47.

Now, referring to FIG. 3, a method of operating a utility meter 1 according to an embodiment of the invention is explained. Further to the embodiment described in relation to FIG. 2, the present embodiment as illustrated on FIG. 3 furthermore comprises a calibration sequence S11. According to the present embodiment, the method comprises performing the initiation sequence S2 after start S1, then repeatedly performing the calibration sequence S11 and the measurement sequence S7, i.e. before each measurement sequence, a calibration sequence S11 is performed. The calibration sequence S11 comprises a calibration measurement step S8, a calibration conversion step S9, and a calibration control step S10. Steps S8, S9, and S10 may correspond to steps S3, S4, and S5, respectively, only that the steps S8, S9, and S10 of the calibration sequence S11 serves to get a more finely adjusted conversion range 47 of the analog-to-digital converter 3 right before the measurement in the measurement step S3. In this embodiment the control step S5 is included to get the best starting point for the calibration sequence S11, however, in some embodiments the control step S5 may be omitted when using the calibration sequence S11, i.e. when using the calibration control step S10. The calibration control step S10 may in various example embodiment comprise evaluating received digital bit numbers 26 received from the analog-to-digital converter 3 and comparing these to the conversion range 47 of the analog-to-digital converter 3, then sending a DAC control signal 28 to a digital-to-analog converter 4, which converts the digital DAC control signal 28 to an analog ADC control signal 27, which determines the conversion range 47 of the analog-to-digital converter 3.

On FIG. 4 a utility meter 1 according to a further embodiment of the invention is illustrated. The utility meter 1 comprises a measuring system 2, an amplifier 16, a microcontroller 17, a voltage source 24, a de-coupling arrangement 21, and a communication interface 29, such as a display screen, memory or communication antenna. The microcontroller 17 comprises a digital-to-analog converter 4, an analog-to-digital converter 3, and a control unit 18. The control unit 18 comprises a control unit input 19, a control unit output 20, and a control unit signal output 30. Further to the embodiment illustrated on FIG. 1, the digital-to-analog converter 4 comprises a DAC signal input 12 connected to the control unit output 20 and a DAC reference input 14 connected to the voltage source 24 through a decoupling arrangement 21. The control unit 18 is thereby adapted to transmit a DAC control signal 28 to the digital-to-analog converter 4. Also, and further the embodiment illustrated on FIG. 1, the ADC signal output 10 is connected to the control unit input 19, such that the control unit 18 can receive and record digital bit numbers 26 transmitted from the analog-to-digital converter 3. Finally, the control unit may transmit a digital signal 37 to the communication interface 29, via the control unit signal output 30 and an interface signal input 31 of the communication interface 29. Now, on the basis of a set digital bit numbers 26, the control unit 18 determines a new reference value for the analog-to-digital converter 3. This is done by sending the DAC control signal 28 to the digital-to-analog converter 4, which transforms this digital DAC control signal 28 into an analog ADC control signal 27, which is transmitted to the analog-to-digital converter 3 as explained in relation to the embodiment of FIG. 1. Now turning to the amplifier 16, this amplifier 16 amplifies the measurement signal 6 into an amplified measurement signal 25, which is transmitted to the analog-to-digital converter 3. The amplifier 16 is powered by the power source 24, which is also used to give a reference value to the DAC reference input 14. In order to avoid coupling of the noise on the reference value of the digital-to-analog converter 4 and the amplification of the measurement signal 6, the de-coupling arrangement 21 is employed, comprising e.g. a resistor 22 and a capacitor 23.

On FIG. 5 is illustrates a utility meter 1 according to another embodiment of the invention. Further to embodiments illustrated on FIGS. 1 and 4, the utility meter 1 of this embodiment furthermore comprises a second digital-to-analog converter 32, receiving a second DAC control signal 33 from the control unit 18. The second digital-to-analog converter 32 converts this second DAC control signal 33 to a DC modification signal 34 being an analog DC signal, which is transmitted to a DC offset modifier 35. The DC offset modifier 35 adds the DC correction signal 34 to the amplified measurement signal 25. Now, the second DAC control signal 33 is set by the control unit 18 based on the digital bit number 26 received from the analog-to-digital converter 3. More specific, the control unit 18 outputs the second DAC control signal 33 being the difference between the average of the digital bit numbers 26 over one measuring step S4 and the mid-point of the conversion range 47 of the analog-to-digital converter 3, namely half the ADC control signal 27. In an example embodiment, the analog-to-digital converter 3 has a 12 bit output, i.e. the digital bit number 26 may be any number between 0 and 4095. If the average digital bit number 26 over one measuring step S4 is e.g. 3000, the average is in other words offset from the conversion range 47 of the analog-to-digital converter 3 by 1095. Therefore, a corresponding DC voltage should be subtracted from the measurement signal 6. The control unit 18 transmits a second DAC control signal 33 to the second digital-to-analog converter 32, which transforms the second DAC control signal 33 into a corresponding DC modification signal 34, which is then used by the DC offset modifier 35 to modify the measurement signal 6 into a DC corrected signal 36. Therefore, when recording the analog signal of the subsequent measurement step S4, the DC offset of the measurement signal 6 may then be compensated, at least partly, especially for signals where the DC signal does not change or changes slowly, which may often be the case.

Referring now to FIG. 6, a spectrum of an analog measurement signal 6 and its corresponding recorded digital bit numbers 26 are shown, illustrating the signal voltage 46 as a function of time 45. The conversion range 47 of the analog-to-digital converter 3 is shown from 0 volts to a conversion range upper value 40, which may e.g. be 5 volts or 10 volts. As the measurement signal 6 exceeds the conversion range upper value 40 for some bit numbers 39, these bit numbers 39 are exactly the conversion range upper value 40. Now, when a measurement signal 6 as shown on FIG. 6 is recorded, the control unit 18 can regulate the utility meter 1 according to different strategies. A first strategy may be to increase the conversion range 47, so that the conversion range upper value 40 exceeds the maximum point of the measurement signal 6. This may be done by setting the voltage of the ADC reference input 11 as shown in previous explained embodiments using a digital-to-analog converter 4. More specifically, the conversion range 47 may be set to contain the measurement signal 6 within a safety range 38, i.e. below a safety range upper value 41 and a safety value lower value 42. Another strategy may regulate the analog measurement signal 6 before the analog-to-digital converter 3, using a second digital-to-analog converter 32 and a DC offset modifier 35, as explained in relation to previous embodiments. More specifically, the measurement signal 6 may be DC shifted by subtracting a DC correction signal 34, the DC correction signal 34 being established as the difference between a signal average value 26, being the average of the measurement signal 6, e.g. established on the basis of the bit numbers 26, and a conversion range midpoint 43. Of course, these two strategies may be combined, either in a step-by-step joint strategy, e.g. first correcting the DC offset, then correcting the conversion range 47, or opposite, or in simultaneous joint strategy setting both the DC offset and correcting the conversion range 47. As can be seen on FIG. 6, the digital bit numbers 26 are rounded of relative to their corresponding measurement signal 6 due to the limited resolution of the analog-to-digital converter. Therefore, for smaller variations of the measurement signal 6, e.g. as seen on the left part of the graph, the analog-to-digital converter is not accurate enough to resolve the change of the measurement signal 6. Since the rounding of depends on resolution the analog-to-digital converter, which is fixed for a given analog-to-digital converter, it may be advantageous to maximize the measurement signal 6 relative to the conversion range 47, thereby minimizing the ratio between the average rounding off and the typical variation between vertical variation between digital bit numbers 26.

Furthermore, referring to FIG. 7, a utility meter 1 is illustrated according to an embodiment of the invention. A measurement system 2 is electrically connected to an input of an operational amplifier 16, via a resistor 22 and capacitor 23. Also, a voltage source 24 provides a voltage to another input of the operational amplifier 16. An output of the operational amplifier 16 is electrically connected to the first input of the operational amplifier 16 through a resistor 22. The utility meter 1 furthermore comprises an analog-to-digital converter 3 having a differential signal input adapted to measure differential signals, the differential signal input comprising a first ADC signal input 9A and a second ADC signal input 9B. The output of the operational amplifier 16 is connected to the first ADC signal input 9A of the analog-to-digital converter 3. The voltage source 24 is furthermore electrically connected to a second ADC signal input 9A of the analog-to-digital converter 3. An output 26 of the analog-to-digital converter 3 is connected to an input of a control unit 18. An ADC control signal 27 being an output of the control unit 18 is connected as to a reference input of a digital-to-analog converter 4. An output of the digital-to-analog converter 4 is electrically connected to an ADC reference input 11 of the analog-to-digital converter 3. The capacitor 23 and the resistors 22 together with the operational amplifier 16 perform as a high-pass filter 15 and operational amplifier 16 of a signal from the measurement system 2. Although the filter 15 and/or operational amplifier 16 may be dispensed with in certain setups, it is preferred to include these in many practical situations. It is to be understood that many other amplification and filtering setups may be realized according to the specific situation, e.g. based on the characteristics of the output signal from the measurement system 2 or on needs by e.g. the analog-to-digital converter. In the present embodiment the voltage source 24 provides a signal only for the operational amplifier 16 as well as a fixed second ADC signal input. Other components or circuits use this signal as well.

In the above described setup, a utility parameter, such as e.g. a flow of a fluid through a flow channel, is measured by the measuring system 2. Based on this measurement, the measuring system 2 transmits an electronic signal. This electronic signal is filtered and amplified by means of the filtering arrangement 15 and operational amplifier 16, before it is inputted to a first ADC signal input 9A. The analog-to-digital converter 3 then converts the differential signal between the first and second ADC signal input 9A, 9B to a digital signal or bit number 26. This conversion is performed based on a conversion range 47, which is defined by the ADC control signal 27, e.g. as the interval from minus the voltage corresponding to the ADC control signal 27 to plus the voltage corresponding to the ADC control signal 27. The control unit 18 receives the digital bit number 26 and may then adjust the DAC control signal 28 based on the digital bit number 26 and the previous DAC control signal 28. Since the DAC control signal 28 in essence may be the digital version of the signal defining the conversion range 27, the criteria for the control unit 18 to change the DAC control signal 28 may e.g. be to optimize the utilization of the conversion range 47 with a certain safety margin. E.g. the criteria may be to utilize 80 or 90% of the conversion range. Of course the criteria may include considerations related to how symmetric the signal inputted to the analog-to-digital converter 3 is compared to the conversion range 47, historic values of e.g. the DAC control signal 28, the input signals or other signal, values, parameters, etc.

Furthermore, referring to FIG. 8, a utility meter 1 is illustrated according to an embodiment of the invention. A measurement system 2 is electrically connected to an input of an operational amplifier 16, via a resistor 22 and capacitor 23. Also, a voltage source 24 provides a voltage to another input of the operational amplifier 16. An output of the operational amplifier 16 is electrically connected to the first input of the operational amplifier 16 through a resistor 22. The utility meter 1 furthermore comprises an analog-to-digital converter 3 having a differential signal input adapted to measure differential signals, the differential signal input comprising a first ADC signal input 9A and a second ADC signal input 9B. The output of the operational amplifier 16 is connected to the first ADC signal input 9A of the analog-to-digital converter 3. An output 26 of the analog-to-digital converter 3 is connected to an input of a control unit 18. A first ADC control signal 27 being an analog conversion by a first digital-to-analog converter 4 of a first digital DAC control signal 28 again being an output of the control unit 18 is connected as to a reference input of a digital-to-analog converter 4. An output of the digital-to-analog converter 4 is electrically connected to an ADC reference input 11 of the analog-to-digital converter 3. A second DAC control signal 33 is outputted from the control unit 18 to a second digital-to-analog converter 32 and converted to a second ADC control signal 48. This second ADC control signal 48 is inputted to a second ADC signal input 9B of the analog-to-digital converter 3. The capacitor 23 and the resistors 22 together with the operational amplifier 16 perform as a high-pass filter 15 and operational amplifier 16 of a signal from the measurement system 2. Although the filter 15 and/or operational amplifier 16 may be dispensed with in certain setups, it is preferred to include these in many practical situations. It is to be understood that many other amplification and filtering setups may be realized according to the specific situation, e.g. based on the characteristics of the output signal from the measurement system 2 or on needs by e.g. the analog-to-digital converter. In the present embodiment the voltage source 24 provides electrical power for the operational amplifier 16. Other components may draw electrical power from other electric power sources.

The operation according to the present embodiment is somewhat similar to the operation of the operation illustrated on FIG. 7. However, in the present embodiment, the control unit 18 may control the second ADC input 9B through the second digital-to-analog converter 32. Thereby, the control unit 18 may not only control the ADC reference input 11 and thereby the effective conversion range but also one of the two ADC signal inputs from which the differential signal of the analog-to-digital converter 3 to be converted is made.

Furthermore, referring to FIG. 9, a utility meter 1 is illustrated according to an embodiment of the invention. The setup and operation of the utility meter 1 according to the present embodiment is similar to the setup and operation of utility meters 1 described in relation to FIGS. 7 and 8. However, whereas the second ADC signal input 9B is controlled solely by a fixed voltage source 24 on FIG. 7, and solely by the control unit 18 through the second digital-to-analog converter 32 on FIG. 8, the second ADC signal input 9B is in the present embodiment controlled by a combination of these two setups, namely by combining a voltage from the voltage source 24 with a voltage from the second digital-to-analog converter 32 through a voltage divider composed by two resistors 22. Thereby, it may typically be possible to operate the utility meter 1 using the second ADC control signal 48 to correct errors and offsets.

Furthermore, referring to FIG. 10, a utility meter 1 is illustrated according to an embodiment of the invention. The setup and operation of the utility meter 1 according to the present embodiment is similar to the setup and operation of utility meter 1 described in relation to FIG. 7. However, whereas the second ADC signal input 9B is controlled solely by a fixed voltage source 24 on FIG. 7, the second ADC signal input 9B is in the present embodiment is connected to through a low-pass filter 49, comprising a resistor 22 and a capacitor 23, to a the output of the operational amplifier 16. Therefore, due to the low-pass filter 49, the signal voltage of the second ADC signal input 9B may be relatively constant relative to the signal voltage on the first ADC signal input 9A. Thereby, it may typically be possible to operate the utility meter 1 using the second ADC control signal 48 to correct errors and offsets.

The invention has been exemplified above with reference to specific examples and methods. However, it should be understood that the invention is not limited to the particular examples described above but may be designed and altered in a multitude of varieties within the scope of the invention as specified in the claims. According to the present invention the embodiments mentioned in the specification of this patent application may be combined to obtain further embodiments according to the present invention.

LIST OF REFERENCE NUMERALS

1. Utility meter
2. Measuring system
3. Analog-to-digital converter
4. Digital-to-analog converter
5. Measuring output
6. Measurement signal
7. Measurement output
8. Utility parameter
9. ADC signal input
9A. First ADC signal input
9B. Second ADC signal input
10. ADC signal output
11. ADC reference input
12. DAC signal input
13. DAC signal output
14. DAC reference input
15. Filtering arrangement
16. Amplifier
17. Microcontroller
18. Control unit
19. Control unit input
20. Control unit output
21. De-coupling arrangement
22. Resistor
23. Capacitor
24. Voltage source
25. Amplified measurement signal
26. Digital bit number
27. ADC control signal
28. DAC control signal
29. Communication interface
30. Control unit signal output
31. Interface signal input
32. Second digital-to-analog converter
33. Second DAC control signal
34. DC modification signal
35. DC offset modifier
36. DC corrected signal
37. Digital signal
38. Safety range
39. Cut-off bit number
40. Conversion range upper value
41. Safety range upper value
42. Safety range lower value
43. Conversion range mid-point
44. Signal average value
45. Time
46. Signal voltage
47. Conversion range
48. Second ADC control signal
49. Low-pass filter
S1. Start
S2. Estimation step
S3. Measurement step
S4. Conversion step
S5. Control step
S6. Initiation step
S7. Measurement sequence
S8. Calibration measurement step
S9. Calibration conversion step
S10. Calibration control step
S11. Calibration sequence

The invention claimed is:

1. A utility meter for measuring a utility parameter, said utility meter comprising
a measuring system,
an analog-to-digital converter having a conversion range, and
a control unit,
said measurement system being adapted for measuring said utility parameter and transmitting a measurement signal representative of said utility parameter to said analog-to-digital converter,
said analog-to-digital converter being adapted for converting said measurement signal into a digital bit number and transmitting said digital bit number to said control unit,
wherein said control unit is configured for controlling the transmission of an ADC control signal based on a set of digital bit numbers to said analog-to-digital converter so as to control the conversion range;
wherein said utility meter is adapted to extract timing data from said set of digital bit numbers; and
wherein the utility meter is configured to calculate said utility parameter at least partly based on the extracted timing data.

2. The utility meter according to claim 1,
wherein said utility meter furthermore comprises a digital-to-analog converter, said digital-to-analog converter being configured for receiving a DAC control signal from said control unit, converting said DAC control signal into said ADC control signal and transmitting said ADC control signal to said analog-to-digital converter.

3. The utility meter according to claim 1,
wherein said utility meter is an ultrasonic flow-meter measuring fluid flow through a flow compartment.

4. The utility meter according to claim 2,
wherein said utility meter furthermore comprises a microcontroller, said digital-to-analog converter and said analog-to-digital converter being contained in said microcontroller.

5. The utility meter according to claim 1,
wherein said utility meter comprises a filtering arrangement for filtering the output of said analog-to-digital converter.

6. The utility meter according to claim 1,
wherein said control unit is adapted to control the ADC control signal based on at least a maximum value of said digital bit numbers of said set of digital bit numbers.

7. The utility meter according to claim 1,
wherein said control unit is adapted to control the ADC control signal based on at least a minimum value of said digital bit number of said set of digital bit numbers.

8. The utility meter according to claim 1,
wherein said measurement signal comprises an AC signal part and a DC signal part, and
wherein said control unit is adapted to modify said DC signal part relative to the conversion range of the analog-to-digital converter.

9. The utility meter according to claim 1,
wherein said utility meter furthermore comprises a DC offset modifier,
wherein said control unit is adapted to control the transmission of a DC modification signal to the DC offset modifier, and
wherein said DC offset modifier is adapted to modify a DC level of the measurement signal.

10. The utility meter according to claim 9,
wherein said utility meter furthermore comprises a digital-to-analog converter, wherein said control unit is configured to transmit a DAC control signal to the digital-to-analog converter, and wherein said digital-to-analog converter is adapted to convert the DAC control signal into said DC modification signal.

11. The utility meter according to claim 1, wherein said control unit furthermore comprises a control unit signal output electrically connected to an interface signal input of a communication interface.

12. The utility meter according to claim 2, wherein the utility meter furthermore comprises an amplifier, said amplifier being connected so as to amplify said measurement signal before the conversion of the measurement signal into said digital bit number in said analog-to-digital converter;

wherein said utility meter comprises a voltage source for supplying voltage to said amplifier, and for supplying a reference voltage to said digital-to-analog converter.

13. The utility meter according to claim 12, wherein the utility meter furthermore comprises an amplifier, said amplifier being connected so as to amplify said measurement signal before the conversion of the measurement signal into said digital bit number in said analog-to-digital converter;

wherein said voltage source is de-coupled between the digital-to-analog converter and the amplifier by a de-coupling arrangement.

14. The utility meter according to claim 1, wherein the utility meter furthermore comprises an amplifier, said amplifier being connected so as to amplify said measurement signal before the conversion of the measurement signal into said digital bit number in said analog-to-digital converter.

15. The utility meter according to claim 1, wherein said analog-to-digital converter comprises an ADC signal input and an ADC reference input, said ADC signal input being a differential input adapted for receiving a differential signal, said ADC signal input comprising a first ADC signal input, a second ADC signal input, said analog-to-digital converter being adapted for measuring a differential signal between said first and second ADC signal inputs, said first ADC signal input being electrically connected to said measuring system.

16. The utility meter according to claim 15, wherein the control unit is adapted to at least partly control the voltage of said second ADC signal input.

17. The utility meter according to claim 1, wherein said analog-to-digital converter comprises an ADC reference input, and wherein the conversion range of said analog-to-digital converter is defined as the range from minus the voltage value on said ADC reference input to plus the voltage value of said ADC reference input.

18. A method of operating a utility meter, said utility meter comprising a measuring system, an analog-to-digital converter having a conversion range, and a control unit, said method comprising the steps of measuring a utility parameter by said measuring system and transmitting a corresponding measurement signal to said analog-to-digital converter, converting the measurement signal into a digital bit number by said analog-to-digital converter and transmitting said digital bit number to said control unit, controlling by said control unit the transmission of an ADC control signal based of a set of digital bit numbers to said analog-to-digital converter so as to control the conversion range;

extracting timing data from said set of digital bit numbers; and calculating said utility parameter at least partly based on the extracted timing data.

19. The method according to claim 18 of operating a utility meter, said utility meter furthermore comprises a digital-to-analog converter, said step of controlling the transmission of said ADC control signal comprises the steps of said control unit transmitting a DAC control signal, said digital-to-analog converter converting said DAC control signal into said ADC control signal and transmitting said ADC control signal to said analog-to-digital converter.

* * * * *